United States Patent
Laderer et al.

(10) Patent No.: US 10,056,588 B2
(45) Date of Patent: Aug. 21, 2018

(54) CONDUIT SYSTEM FOR CONNECTING A PLURALITY OF VOLTAGE TAPPING POINTS AND/OR TEMPERATURE MEASURING POINTS OF AN ELECTRO-CHEMICAL DEVICE TO A MONITORING UNIT

(75) Inventors: Mark Laderer, Grabenstetten (DE); Armin Diez, Lenningen (DE); Jan Groshert, Dettingen (DE); Michael Kohnle, Hülben (DE); Wolfgang Fritz, Metzingen (DE); Christoph Tamegger, Grafenberg (DE); Matthias Müller, Pfullingen (DE)

(73) Assignee: ElringKlinger AG, Dettingen (DE)

( * ) Notice: Subject to any disclaimer, the term of this patent is extended or adjusted under 35 U.S.C. 154(b) by 275 days.

(21) Appl. No.: 13/506,796

(22) Filed: May 17, 2012

(65) Prior Publication Data
US 2012/0328919 A1 Dec. 27, 2012

(30) Foreign Application Priority Data
Jun. 1, 2011 (DE) ........................ 10 2011 076 888

(51) Int. Cl.
| | |
|---|---|
| *H01M 2/10* | (2006.01) |
| *H01M 10/48* | (2006.01) |
| *H01M 2/20* | (2006.01) |
| *H01M 10/42* | (2006.01) |
| *G01R 31/36* | (2006.01) |
| *H01M 2/02* | (2006.01) |

(52) U.S. Cl.
CPC ......... *H01M 2/1077* (2013.01); *H01M 2/206* (2013.01); *H01M 10/4207* (2013.01); *H01M 10/482* (2013.01); *H01M 10/486* (2013.01); *G01R 31/3696* (2013.01); *H01M 2/0217* (2013.01); *H01M 2010/4278* (2013.01); *H01M 2220/20* (2013.01)

(58) Field of Classification Search
CPC .... H01M 2/06; H01M 2/0417; H01M 2/0443; H01M 2/043
See application file for complete search history.

(56) References Cited

U.S. PATENT DOCUMENTS

| | | | |
|---|---|---|---|
| 5,711,675 A | 1/1998 | Nishitani et al. | 439/34 |
| 6,168,470 B1 | 1/2001 | Ikeda et al. | 439/621 |
| 6,376,768 B1 | 4/2002 | Saito et al. | 174/48 |

(Continued)

FOREIGN PATENT DOCUMENTS

| | | |
|---|---|---|
| DE | 44 47 719 C2 | 2/1999 |
| DE | 198 47 190 A1 | 6/1999 |

(Continued)

*Primary Examiner* — Scott J. Chmielecki

(57) ABSTRACT

In order to enable a connection between measuring points of an electro-chemical device and a monitoring unit of the electro-chemical device to be easily and rapidly established, there is proposed a conduit system for connecting a plurality of voltage tapping points and/or temperature measuring points of an electro-chemical device to a monitoring unit of the electro-chemical device which comprises a plurality of voltage tapping lines and/or temperature measuring lines and a stiffening structure in which and/or on which the plurality of voltage tapping lines and/or temperature measuring lines are arranged at least in sections thereof.

13 Claims, 6 Drawing Sheets

(56) References Cited

U.S. PATENT DOCUMENTS

| | | | |
|---|---|---|---|
| 6,479,187 B1 | 11/2002 | Takasaki et al. | |
| 2002/0086578 A1 | 7/2002 | Ikeda | 439/500 |
| 2002/0098734 A1 | 7/2002 | Ikeda | |
| 2007/0279001 A1* | 12/2007 | Tononishi | H01M 2/06 320/112 |
| 2009/0274952 A1* | 11/2009 | Wood | B60L 11/1874 429/99 |
| 2010/0055993 A1 | 3/2010 | Ikeda et al. | |
| 2010/0124693 A1* | 5/2010 | Kosugi | G01R 31/3644 429/92 |
| 2011/0076521 A1 | 3/2011 | Shimizu et al. | |
| 2011/0097608 A1* | 4/2011 | Park | H01M 2/0207 429/7 |
| 2011/0195285 A1* | 8/2011 | Shin | H01M 2/22 429/93 |
| 2012/0009447 A1 | 1/2012 | Ikeda et al. | 429/90 |
| 2012/0019061 A1 | 1/2012 | Nishihara et al. | 307/10.1 |

FOREIGN PATENT DOCUMENTS

| | | |
|---|---|---|
| DE | 100 53 363 A1 | 6/2001 |
| DE | 10 2009033044 | 3/2010 |
| DE | 10 2010035114 | 4/2011 |
| DE | 10 2010 039 417 A1 | 2/2012 |
| EP | 1 058 332 A2 | 12/2000 |
| EP | 2 712 004 A1 | 11/2012 |
| WO | WO 2007102671 | 9/2007 |
| WO | WO 2008074034 | 6/2008 |
| WO | WO 2009/022521 A1 | 2/2009 |
| WO | WO 2010/113455 | 10/2010 |

\* cited by examiner

CONDUIT SYSTEM FOR CONNECTING A PLURALITY OF VOLTAGE TAPPING POINTS AND/OR TEMPERATURE MEASURING POINTS OF AN ELECTRO-CHEMICAL DEVICE TO A MONITORING UNIT

RELATED APPLICATION

The present disclosure relates to the subject matter disclosed in German Patent Application No. 10 2011 076 888.2 of Jun. 1, 2011, the entire specification of which is incorporated herein by reference.

FIELD OF DISCLOSURE

The present invention relates to a conduit system for connecting a plurality of voltage tapping points or temperature measuring points of an electro-chemical device to a monitoring unit of the electro-chemical device.

BACKGROUND

In electro-chemical devices, especially accumulators, it is necessary to monitor the electro-chemical cells in regard to their respective electrical voltages and temperatures when the particular electro-chemical device is operational.

In the case of known electro-chemical devices, the electrical voltage is tapped-off by means of a metallic connection to a cell connector, which interconnects cell terminals of different electro-chemical cells of the electro-chemical device, by means of a circuit board, directly by means of a circuit board or by means of individual stranded conductors.

Such conduit systems for connecting voltage measuring points to a monitoring unit of the electro-chemical device are very complex to assemble, have a very rigid structure due to which there is no flexibility in the connection between the electro-chemical cells and the monitoring unit, and are only usable for restricted combinations of materials.

SUMMARY OF THE INVENTION

The object of the present invention is to enable a connection between the measuring points of an electro-chemical device and a monitoring unit of the electro-chemical device to be established and assembled in a simple and rapid manner.

In accordance with the invention, this object is achieved by means of a conduit system for connecting a plurality of voltage tapping points and/or temperature measuring points of an electro-chemical device to a monitoring unit of the electro-chemical device which comprises a plurality of voltage tapping lines and/or temperature measuring lines and a stiffening structure in which and/or on which the plurality of voltage tapping lines and/or temperature measuring lines are arranged at least in sections thereof.

The conduit system in accordance with the invention enables the voltage tapping lines and temperature measuring lines to be easily and rapidly mounted on the electro-chemical device and also enables the voltage tapping points and temperature measuring points of the electro-chemical device to be connected to the voltage tapping lines and temperature measuring lines of the conduit system in a simple and rapid manner.

Each position of the electro-chemical device can be specifically accessed for tapping-off the voltage or temperature by the use of individual voltage tapping lines and/or temperature measuring lines.

In the conduit system in accordance with the invention, the most varied of materials can be connected to one another.

The conduit system in accordance with the invention is highly flexible in regard to the connection between the plurality of voltage tapping points and/or temperature measuring points and the monitoring unit of the electro-chemical device.

It is particularly expedient if a temperature monitoring function is integrated into the conduit system in that the conduit system comprises temperature measuring lines.

The conduit system in accordance with the invention enables a flexible connection to be established between the voltage tapping points and temperature measuring points of the electro-chemical device on the one hand and the monitoring unit of the electro-chemical device on the other.

In particular, it is also possible for large distances between the voltage tapping points and temperature measuring points and the monitoring unit to be overcome in a simple and economical manner by means of the conduit system in accordance with the invention.

The voltage tapping lines and/or temperature measuring lines of the conduit system can form a wiring harness.

The wiring harness is inherently stable at least in sections thereof due to the stiffening structure.

The stiffening structure is connected to the voltage tapping lines and/or the temperature measuring lines of the conduit system at least for a period of time. The stiffening structure can remain in the conduit system after these lines have made contact with the respective measuring points; however, it is also conceivable for the stiffening structure to serve only as an aid to the assembly process and for it to be removed from the conduit system after the lines have made contact with the respective measuring points of the voltage tapping lines and/or the temperature measuring lines.

In order to provide a high degree of flexibility when assembling the electro-chemical device, it is expedient if at least one of the voltage tapping lines and/or at least one of the temperature measuring lines of the conduit system comprises a measuring point section which is connectable to a temperature measuring point or to a voltage tapping point and is arranged outside the stiffening structure Furthermore, the conduit system preferably comprises a multi-pole plug which is connected to a plurality of voltage tapping lines and/or temperature measuring lines of the conduit system and to which a preferably multi-pole connecting line leading to the monitoring unit of the electro-chemical device is connectable.

Preferably, the conduit system comprises at least one temperature sensor which is preferably connected to at least one temperature measuring line. Such a temperature sensor can be in the form of an NTC ("Negative Temperature Coefficient") element for example.

In a preferred embodiment of the invention, provision is made for the stiffening structure to be connected to the voltage tapping lines and/or the temperature measuring lines of the conduit system in releasable manner.

In particular, provision may be made for the stiffening structure to serve merely as an aid to the assembly process or as a sub-frame and for it to be removed from the electro-chemical device as soon as the voltage tapping lines and the temperature measuring lines have made contact with the respective voltage tapping points and temperature measuring points of the electro-chemical device.

The stiffening structure may, for example, comprise at least one seating channel for accommodating at least one voltage tapping line and/or at least one temperature measuring line.

It is particularly expedient if the entire wiring harness consisting of voltage tapping lines and/or temperature measuring lines is insertable as a whole into one or more seating channels of the stiffening structure of the conduit system in accordance with the invention and is fixable to the stiffening structure. In this case, the process of manufacturing the conduit system in accordance with the invention is particularly easy to automate.

The wiring harness can be fixed to the stiffening structure by a cover or by holding devices such as clips or cable straps for example.

The stiffening structure preferably comprises at least one branching point at which two or more seating channels are connected together.

In particular, provision may be made for the stiffening structure to comprise at least one main seating channel from which one or more subsidiary seating channels are branched off.

The conduit system can comprise a sealing cover for the at least partial closure of at least one seating channel of the stiffening structure. In this way, it is possible to fix the voltage tapping lines and/or the temperature measuring lines that have been inserted into the stiffening structure to the stiffening structure for at least a period of time.

Furthermore, the conduit system may comprise at least one holding device by means of which at least one voltage tapping line and/or at least one temperature measuring line is fixable to the stiffening structure, preferably, in releasable manner.

The stiffening structure can comprise an injection mouldable material, especially a thermoplastic synthetic material. In particular, the stiffening structure can be formed substantially in its entirety from an injection mouldable and in particular, thermoplastic material.

Coming into consideration as materials for the stiffening structure are, in particular, PBT (polybutylenterephthalate), PP (polypropylene), PA (polyamide), ABS (acrylonitrile butadiene styrene) and/or LCP ("Liquid Crystal Polymer").

The stiffening structure may comprise an injection moulded part for example.

Alternatively or in addition thereto, provision may be made for the stiffening structure to comprise a metallic shaped part consisting of aluminium for example.

Such shaped parts can be in the form of a stamped bent part and/or in the form of a rail having a U-shaped profile for example.

Alternatively or in addition thereto, provision may be made for the stiffening structure to comprise a sheathing which is formed on sections of the voltage tapping lines and/or on sections of the temperature measuring lines.

The material of the sheathing may comprise, in particular, a synthetic material and especially an elastomer material.

Preferably, the sheathing is formed substantially in its entirety from a synthetic material, and in particular from an elastomer material.

The sheathing can be formed, in particular, by a process of spraying the sections of voltage tapping lines and/or the sections of temperature measuring lines.

By virtue of such a sheathing, the conduit system remains flexible but nevertheless can be handled easily when assembling the electro-chemical device.

The conduit system in accordance with the invention is particularly suitable for use in an electro-chemical device which comprises a plurality of electro-chemical cells and at least one conduit system in accordance with the invention.

Furthermore, in a preferred embodiment of the electro-chemical device, provision is made for the electro-chemical device to comprise at least one cell connector for the electrically conductive connection of a first cell terminal of a first electro-chemical cell and a second cell terminal of a second electro-chemical cell, wherein at least one voltage tapping line and/or at least one temperature measuring line of the conduit system is connected to at least one cell connector.

In order to prevent unintentional contact with functional elements of the electro-chemical device and especially with cell connectors or power connectors, the electro-chemical device can comprise a cover which comprises a carrier element that faces the electro-chemical cells of the electro-chemical devices and a covering element that is remote from the electro-chemical cells of the electro-chemical device, wherein the conduit system is preferably arranged between the carrier element and the covering element.

In particular, at least one conduit system in accordance with the invention can be fixed to the carrier element of the cover by a suitable holding device, preferably in releasable manner. In this case, the carrier element and the at least one conduit system form a pre-mounted sub-assembly which is manipulable as a single unit during the assembly of the electro-chemical device.

It is particularly expedient hereby, if at least one cell connector of the electro-chemical device is held on the carrier element of the cover.

The stiffening structure of at least one conduit system can also be formed in one piece manner with the carrier element of the cover.

In this description and in the accompanying Claims, a "cover" for an electro-chemical device is to be understood as being any element which is intended for covering at least a part of the electro-chemical device. Hereby in particular, the covered part can be an electro-chemical module of the electro-chemical device or else just a part of an electro-chemical module.

The electro-chemical device together with the conduit system in accordance with the invention can, in particular, be in the form of an accumulator such as a lithium ion accumulator for example.

If the electro-chemical device in accordance with the invention is in the form of an accumulator, it is especially suitable as a heavy duty energy source such as for the drive system of motor vehicles for example.

Further features and advantages of the invention form the subject matter of the following description and the graphic illustration of exemplary embodiments.

BRIEF DESCRIPTION OF THE DRAWINGS

Similar or functionally equivalent elements are designated by the same reference symbols in all the Figures.

DETAILED DESCRIPTION OF THE INVENTION

Figure 1:
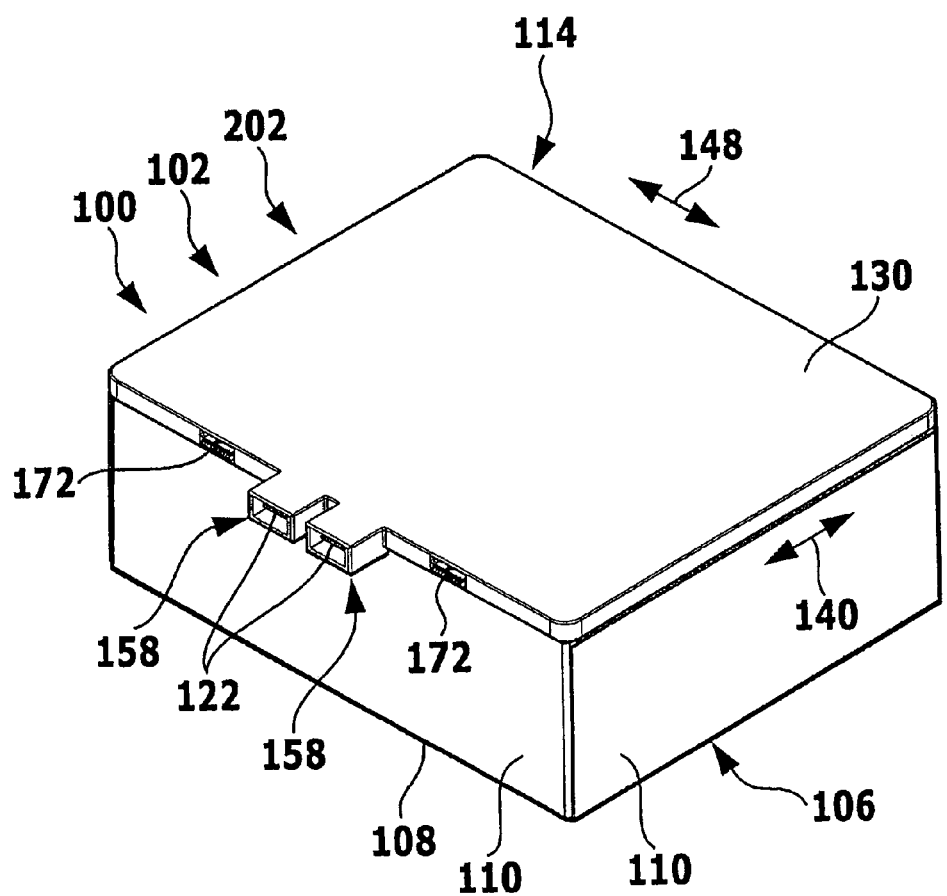
FIG. 1 a schematic perspective illustration of an accumulator module having a housing in which a plurality of electro-chemical cells are arranged and which is covered by a cover that comprises a carrier element and a covering element connected to the carrier element.
Figure 2:
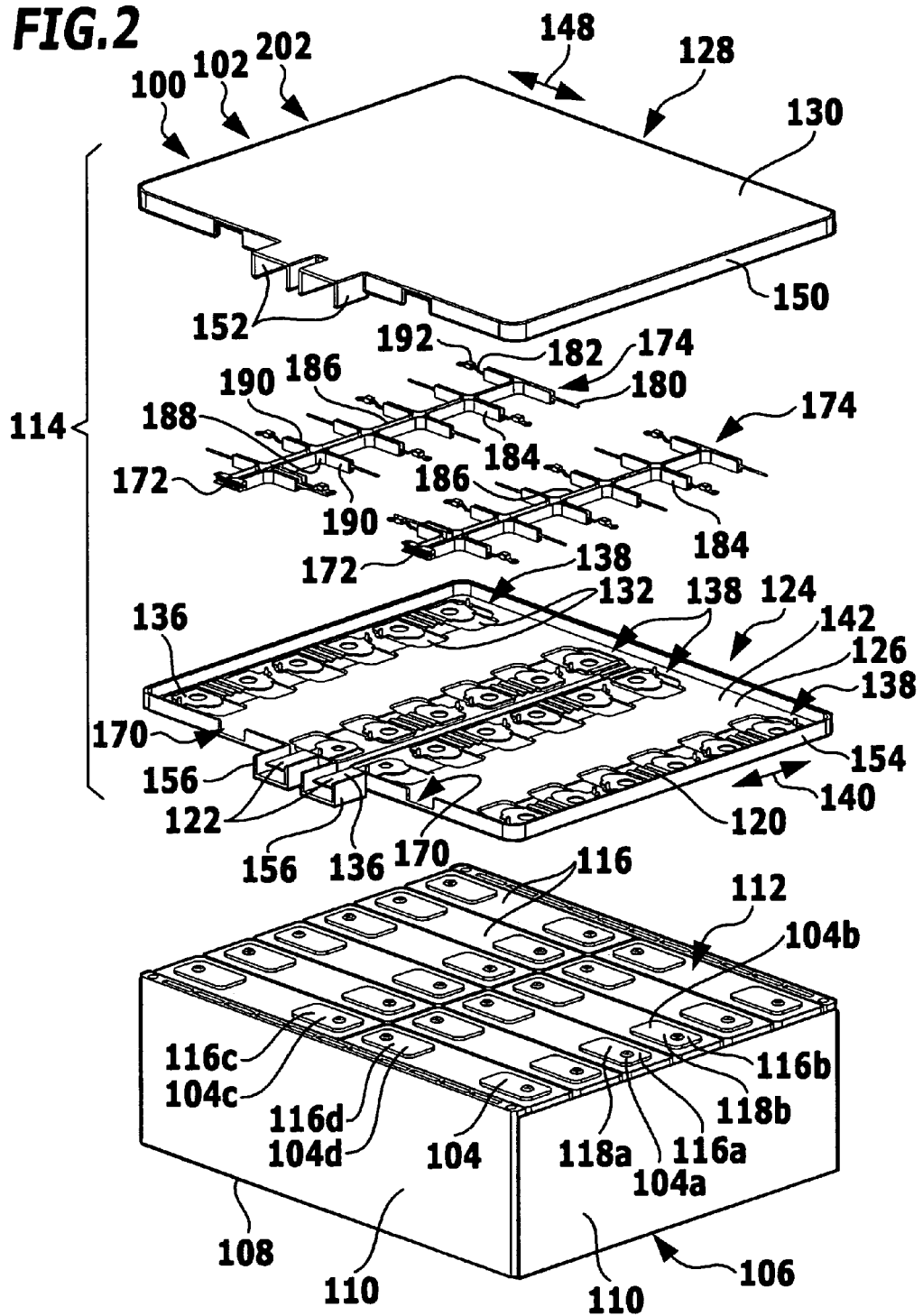
FIG. 2 a schematic perspective exploded illustration of the accumulator module depicted in FIG. 1 in which the housing of the accumulator module together with the electro-chemical cells that are arranged therein, the carrier element having the cell connectors arranged thereon, conduit systems for connecting voltage tapping points and temperature measuring points of the cell connectors to multi-pole plugs and the covering element are illustrated separately.

An electro-chemical device bearing the general reference 100 comprises a plurality of electro-chemical modules 102 for example, each of said modules comprising a plurality of electro-chemical cells 104, in the illustrated exemplary embodiment there are twelve, which are arranged next to each other in a housing 106 of the electro-chemical module 102 (see FIGS. 1 and 2).

The housing 106 can, for example, be substantially cuboidal and comprise a bottom wall 108 and side walls 110 which extend away from the bottom wall 108, wherein the edges of said side walls that are remote from the bottom wall 108 surround a housing opening 112 which is closable by means of a cover 114.

The electro-chemical cells 104 are arranged and oriented in the housing 106 of the electro-chemical module 102 in such a way that the two cell terminals 116 of each electro-chemical cell 104 are arranged on that side of the respective electro-chemical cell 104 which faces the cover 114.

In each electro-chemical cell 104, one of the cell terminals 116 forms a negative pole 118a and the other respective cell terminal 116 forms a positive pole 118b of the electro-chemical cell 104 concerned.

The electro-chemical device 100 can, in particular, be in the form of an accumulator, and especially in the form of a lithium ion accumulator of the type LiFePO$_4$ for example.

Accordingly, the electro-chemical modules 102 can be in the form of accumulator modules and the electro-chemical cells 104 in the form of accumulator cells, and in particular, in the form of lithium ion accumulator cells of the type LiFePO$_4$ for example.

Furthermore, the electro-chemical module 102 comprises a plurality of cell connectors 120 (see especially FIGS. 2 and 3) by means of which the cell terminals 116 of neighbouring electro-chemical cells 104 of differing polarity are connectable to one another in electrically conductive manner in order to connect all the electro-chemical cells 104 of an electro-chemical module 102 electrically in series in this way.

Hereby, each cell connector 120 connects a first cell terminal 116a of negative polarity of a first electro-chemical cell 104a to a second cell terminal 116b of positive polarity of a neighbouring second electro-chemical cell 104b (see FIG. 2).

Figure 3:
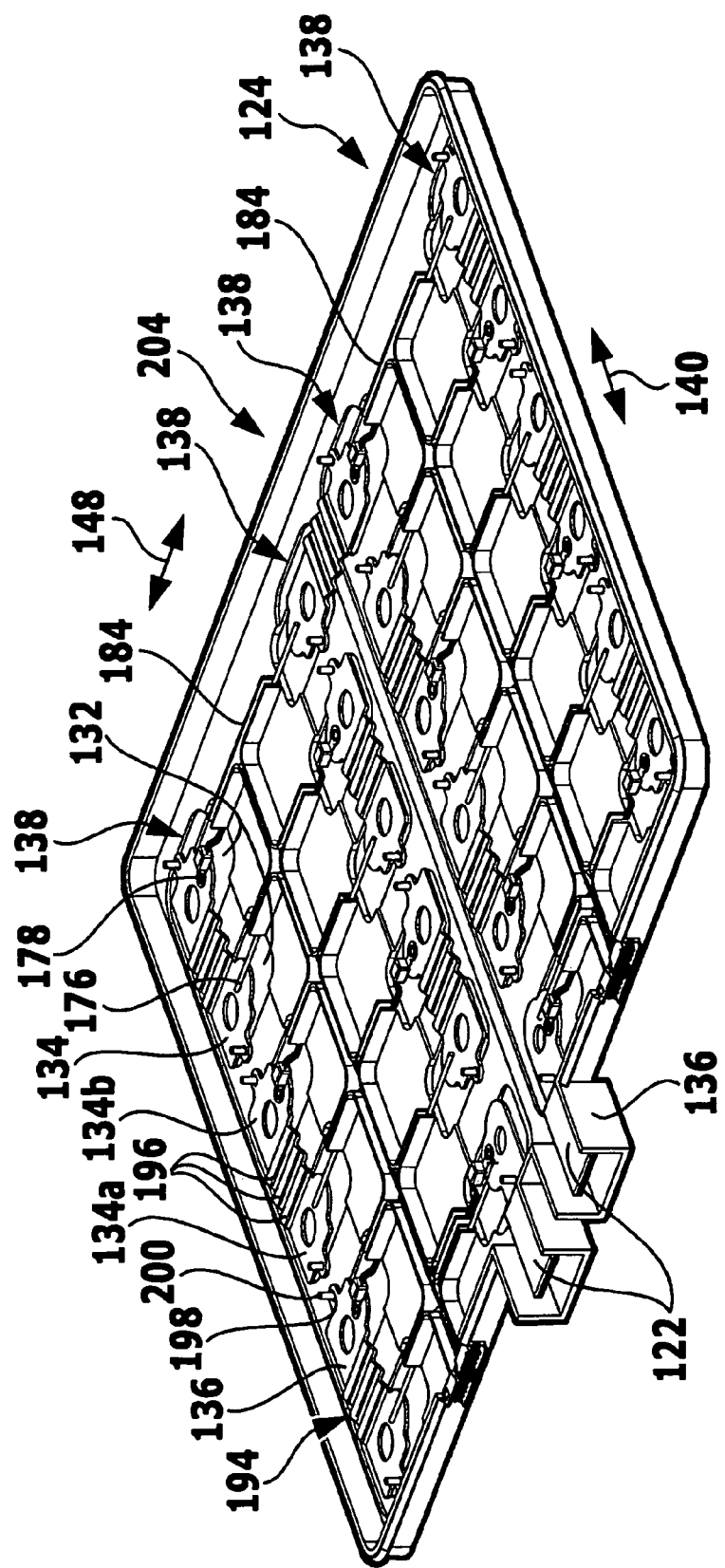
FIG. 3 a schematic perspective illustration of the carrier element with cell connectors arranged thereon and conduit systems arranged thereon for connecting voltage tapping points and temperature measuring points of the cell connectors to the multi-pole plugs.

In each case, a cell terminal 116c of the electro-chemical cell 104c forming the beginning of the series connected cells of the electro-chemical module 102 and a cell terminal 116d of the electro-chemical cell 104d forming the end of the series connected cells are in each case connected in electrically conductive manner to an electrically conductive power connector 122 of the electro-chemical module 102 (see FIGS. 1 to 3).

The several electro-chemical modules 102 of the electro-chemical device 100 are preferably connected electrically in series.

In particular, such a series circuit can be produced by connecting an electrical power connector 120 of a first electro-chemical module to an electrical power connector 120 (of opposite polarity) of a second electro-chemical module in electrically conductive manner by means of a (not illustrated) module connector.

The cover 114 which is placeable on the housing 106 and closes the housing opening 112 in the assembled state is illustrated in detail in FIGS. 2 and 3.

The cover 114 comprises a carrier element 124 in the form of a preferably substantially rectangular base plate 126 for example, and a covering element 128 which is held on the carrier element 124 and is preferably in the form of a substantially rectangular covering plate 130 for example.

As can best be seen from FIG. 3, the carrier element 124 is provided with a plurality of passage openings 132, wherein each access opening 132 is associated with a contact region 134 of a functional element 136 of the electro-chemical device 100 and in particular of the electro-chemical module 102, with a contact region 134 of a cell connector 120 or a power connector 122 in particular, and with a cell terminal 116 of the electro-chemical cells 104 of the electro-chemical device 100 and in particular of the electro-chemical module 102 so that in each case a cell terminal 116 is connectable to an associated contact region 134 of a functional element 136 through such a passage opening 132.

Hereby for example, a cell terminal 116 can extend through the passage opening 132 in order to come into contact with a contact region 134 of a functional element 136.

As an alternative thereto, a contact region 134 of a functional element 136 could also extend through the respectively associated passage opening 132 in order to come into contact with the respectively associated cell terminal 116.

Furthermore, it is also conceivable for both the cell terminal 116 and the contact region 134 of the functional element 136 to extend into the passage opening 132 and be connected to one another there.

As can be seen from FIGS. 2 and 3, the passage openings 132 of the carrier element can be arranged 124 in a plurality of rows 138, wherein the rows 138 extend in a longitudinal direction 140 of the carrier element 124 for example.

In particular, the passage openings 132 can be formed such as to be substantially rectangular; in principle however, it is also possible for the passage openings to have other shapes, and in particular, for them to be circular, oval, square or polygonal passage openings 132.

The covering element 128, which serves for covering the functional elements 136 and in particular the cell connectors 120 and the power connectors 122, is arranged on the outer surface 142 of the carrier element 124 that is remote from the electro-chemical cells 104 in the assembled state of the cover 114.

The covering element 128 is in the form of a deep-drawn part or an injection moulded part for example.

The covering element preferably consists of a thermoplastic material, and in particular, polypropylene.

Preferably, the covering element is formed substantially in its entirety of a thermoplastic material, and in particular of polypropylene.

As can be seen from FIGS. 1 and 2 furthermore, the covering element 128 is preferably provided with an edge region 150 which extends along its outer edge and projects towards the carrier element 124 in the assembled state of the cover 114.

The edge region 150 can be interrupted by two through channels 152 which project outwardly from the edge of the covering element 128 in the longitudinal direction 140 for example, and which may be of substantially U-shaped cross section for example.

As can best be seen from FIG. 2, the carrier element 124 is preferably also provided with an edge region 154 which extends along its outer edge and projects towards the covering element 128 in the assembled state of the cover 114.

The edge region 154 of the carrier element 124 can also be interrupted by two through channels 156 which preferably project outwardly from the edge of the carrier element 124 in the longitudinal direction 140, and which may be of substantially U-shaped cross section for example.

The through channels 156 of the carrier element 124 and the through channels 152 of the covering element 128 are arranged at mutually corresponding points of the respective edge regions 154 and 150 with their open sides facing each other so that the through channels 156, 152 together form a through shaft 158 which serves to accommodate a respective one of the power connectors 122 of the electro-chemical module 102.

In the assembled state of the electro-chemical module 102, each power connector 122 is thereby connected to a cell terminal 116c of the first electro-chemical cell 104c in the series circuit of the electro-chemical module 102 and to a cell terminal 116d of the last electro-chemical cell 104d in the series circuit of the electro-chemical module 102.

In order to enable the covering element 128 to be fixed to the carrier element 124 in releasable manner, there is preferably provided a (not illustrated) latching device which comprises one or more latching elements that are provided on the covering element 128 and one or more latching elements that are provided on the carrier element 124.

The latching element for the carrier element can, for example, be in the form of an outwardly protruding latching bead which is formed on and extends along the edge of the edge region 154 of the carrier element 124 facing the covering element 128.

The latching elements for the covering element can, for example, be in the form of a plurality of latching projections which protrude inwardly from the edge region 150 of the covering element 128 and follow each other in the peripheral direction of the covering element 128.

When the covering element 128 is placed on the carrier element 124 from above, the latching projections pass by the latching bead due to the resilient deformation of the edge region 150 of the covering element 128 and/or that of the latching bead of the carrier element 124 and engage underneath the latching bead so that the covering element 128 is secured to the carrier element 124 by the latching process.

Self-evidently, the latching elements on the covering element 128 and the latching elements on the carrier element 124 could also be formed in any other way insofar as they only enable mutual latching of the covering element 128 and the carrier element 124.

The latching elements 162 of the covering element 128 can be formed or stamped into the covering element 128 or be formed on the covering element 128.

The edge region 154 of the carrier element 124 is preferably provided with one or more recesses 170 for accommodating a preferably multi-pole plug 172.

Each plug 172 serves for connecting a conduit system 174 arranged on the carrier element 124 to a (not illustrated) monitoring unit of the electro-chemical device 100, preferably, via a (not illustrated) multi-pole connecting line.

There are two such conduit systems 174 in the embodiment of an electro-chemical module 102 that is illustrated in the Figures.

Each of the conduit systems 174 serves for connecting a plurality of voltage tapping points 176 and a plurality of temperature measuring points 178 of the electro-chemical module 102 to the (not illustrated) monitoring unit of the electro-chemical device 100.

Each conduit system 174 comprises a plurality of voltage tapping lines 180 each of which leads from a respective voltage tapping point 176 to the plug 172 of the conduit system 174, and a plurality of temperature measuring lines 182 which each lead from a respective temperature measuring point 178 to the plug 172 of the conduit system 174, and it also comprises a stiffening structure 184 on which the voltage tapping lines 180 and the temperature measuring lines 182 are arranged at least in sections thereof.

The stiffening structure 184 of each conduit system 174 is preferably built up in tree-like manner and comprises a main seating channel 168 which extends in the longitudinal direction 140 of the cover 114 for example, and a plurality of subsidiary seating channels 190 which branch off from the main seating channel 168 at branching points 188.

In particular hereby, provision is made for the main seating channel 186 to accommodate a plurality of voltage tapping lines 180 and temperature measuring lines 182 of the conduit system 174, whereas each of the subsidiary seating channels 190 preferably accommodates just one voltage tapping line 180 and/or just one temperature measuring line 182.

The main seating channel 186 and/or the subsidiary seating channels 190 preferably have a substantially U-shaped cross section which is open on the side of the stiffening structure 184 remote from the carrier element 124 so that the voltage tapping lines 180 and the temperature measuring lines 182 can be inserted into the stiffening structure 184 from this side.

The stiffening structure 184 is preferably formed in one piece manner and in particular, it may consist of an injection mouldable material such as PBT (polybutylenterephthalate), PP (polypropylene), PA (polyamide), ABS (acrylonitrile butadiene styrene) and/or LCP ("Liquid Crystal Polymer") for example.

Alternatively or in addition thereto, provision could also be made for the stiffening structure 184 to consist of a metallic material such as aluminium for example, and in particular, for it to be in the form of a shaped metallic part such as a stamped bent part for example.

The stiffening structure 184 may comprise one or more holding devices by means of which the voltage tapping lines 180 and the temperature measuring lines 182 are fixed to the stiffening structure 184, preferably in releasable manner.

Such holding devices can be in the form of e.g. hooks, brackets, latching elements, clips or the like which are arranged on the stiffening structure 184 and/or on the lines 180 or 182.

Again, each stiffening structure 184 of conduit system 174 can be fixed as a whole, especially in releasable manner, to the outer surface 142 of the carrier element 124 which faces the covering element 128 in the assembled state of the cover 114.

The fixing of the stiffening structure 184 to the carrier element 124 can be effected by a latching process, welding and/or adhesion for example.

As an alternative thereto, provision could also be made for the stiffening structure 184 to be formed in one piece manner with the carrier element 124.

The end of each voltage tapping line 180 is connected in electrically conductive manner to a respective contact region 134 of a cell connector 120 or a power connector 122 of the electro-chemical module 102 in order to enable the electrical potential prevailing there to be tapped-off.

The end of each temperature measuring line 182 is connected to a respective temperature sensor 192 which is in the form of an NTC ("Negative Temperature Coefficient") element for example. Each temperature sensor 194 is likewise in contact with a contact region 134 of a cell connector 120 or with a power connector 122 of the electro-chemical module 102 in order to be able to measure the temperature prevailing there.

Each of the contact regions 134 of the cell connector 120 and each power connector 122 is associated with a respective cell terminal 114 of the electro-chemical module 102 and, in the assembled state of the electro-chemical module 102, is connected in electrically conductive, preferably cohesive, manner to the respectively associated cell terminal 114.

Each cell connector 120 comprises two contact regions 134a and 134b for electrically contacting a cell terminal 114 and a compensation region 194 which connects the two contact regions 134a and 134b to one another. The compensation region 194 is preferably deformable in a resilient and/or plastic manner in order to enable relative movement of the two contact regions 134a and 134b of the cell connector 120 relative to each other during operation of the electro-chemical device 100 and/or to enable tolerances to be compensated for when assembling the electro-chemical device 100.

For this purpose, the compensation region 194 can, in particular, comprise one or more compensation undulations 196 that run transversely relative to a connecting direction which interconnects a centre of the first contact region 134a and a centre of the second contact region 134b of the cell connector 120.

Each contact region 134 of the cell connector 120 and the power connectors 122 can be positioned on a respectively associated positioning pin 200 of the carrier element 124 by means of a respective positioning hole 198.

Thereby, the positioning pin 200 of the carrier element 124 preferably enters the respectively associated positioning hole 198 of the cell connector 120 or the power connector 122.

The cover 114 of the electro-chemical module 102, which comprises the carrier element 124 including the conduit systems 174 and the functional elements 136 and also the covering element 128, forms a cell contacting system 202 for contacting and monitoring the electro-chemical cells 104 of the electro-chemical module 102.

The carrier element 124 and/or the covering element 128 preferably consists of an electrically non conductive synthetic material such as PBT, PP, PA, ABS and/or LCP for example, and is preferably formed substantially in its entirety of such a synthetic material.

A particularly suitable material for the carrier element 124 and/or the covering element 128 is a polypropylene material reinforced with talc (for example, the material bearing the designation PP TV20). This material has a particularly high inherent stability due to the talc strengthening.

The carrier element 124 and the conduit systems 174 and also the cell connectors 120 and the power connectors 122 are preferably completely pre-assembled in the form of a separate sub-assembly 204.

In the course of this pre-assembly process, the cell connectors 120 and the power connectors 122 are positioned on the carrier element 124 and the voltage tapping lines 180 and the temperature measuring lines 182 are connected to the cell connectors 120 and the power connectors 122 and also to the plugs 172 and are fixed to the stiffening structures 184 of the conduit systems 174, preferably in releasable manner.

Furthermore, should the stiffening structures 184 not already have been connected to the carrier element 124, in one piece manner for example, then the stiffening structures 184 are fixed to the outer surface 142 of the carrier element 124.

Consequently, all the components needed for contacting the electro-chemical cells 104 of an electro-chemical module 102 are brought together in a sub-assembly 204 that is manipulable as a single entity and are already in their requisite relative positions.

In particular, the cell connectors 120, the power connectors 122 and/or the stiffening structures 184 of the conduit systems 174 can be fixed to the carrier element 124 by a latching process, welding and/or a clipping process.

When assembling an electro-chemical module 102, the carrier element 124 of the cover 114 is placed on the housing 106 in which the electro-chemical cells 104 are arranged and is connected to the edge of the housing 106 surrounding the housing opening 110.

Subsequently, the functional elements 136 and in particular the cell connectors 120 and the power connectors 122 are brought into electrically conductive contact with the respectively associated cell terminals 114 of the electro-chemical module 102, for example, by welding particularly by means of a laser, namely, through the freely accessible passage openings 132 of the carrier element 124 whilst the covering element 128 is still not yet in place.

After contact between the functional elements 136 and the cell terminals 116 of the electro-chemical cells 104 of the electro-chemical module 102 has been established, the covering element 128 is placed on the carrier element 124 and connected thereto, in particular, by means of a latching process so that the covering element 128 covers the functional elements 136 and the passage openings 132 of the carrier element 124 and also the conduit systems 174 and protects them from inadvertent contact.

Damage to the cell contacting system 202 during the processes of transporting and assembling the electro-chemical module 102 is thereby prevented.

The fully assembled electro-chemical module 102 can be combined with a plurality of other electro-chemical modules 102 to form the electro-chemical device 100, whereby in particular, different electro-chemical modules 102 can be coupled together by means of (not illustrated) module connectors which interconnect the power connectors 122 of the different electro-chemical modules 102.

Figure 4:
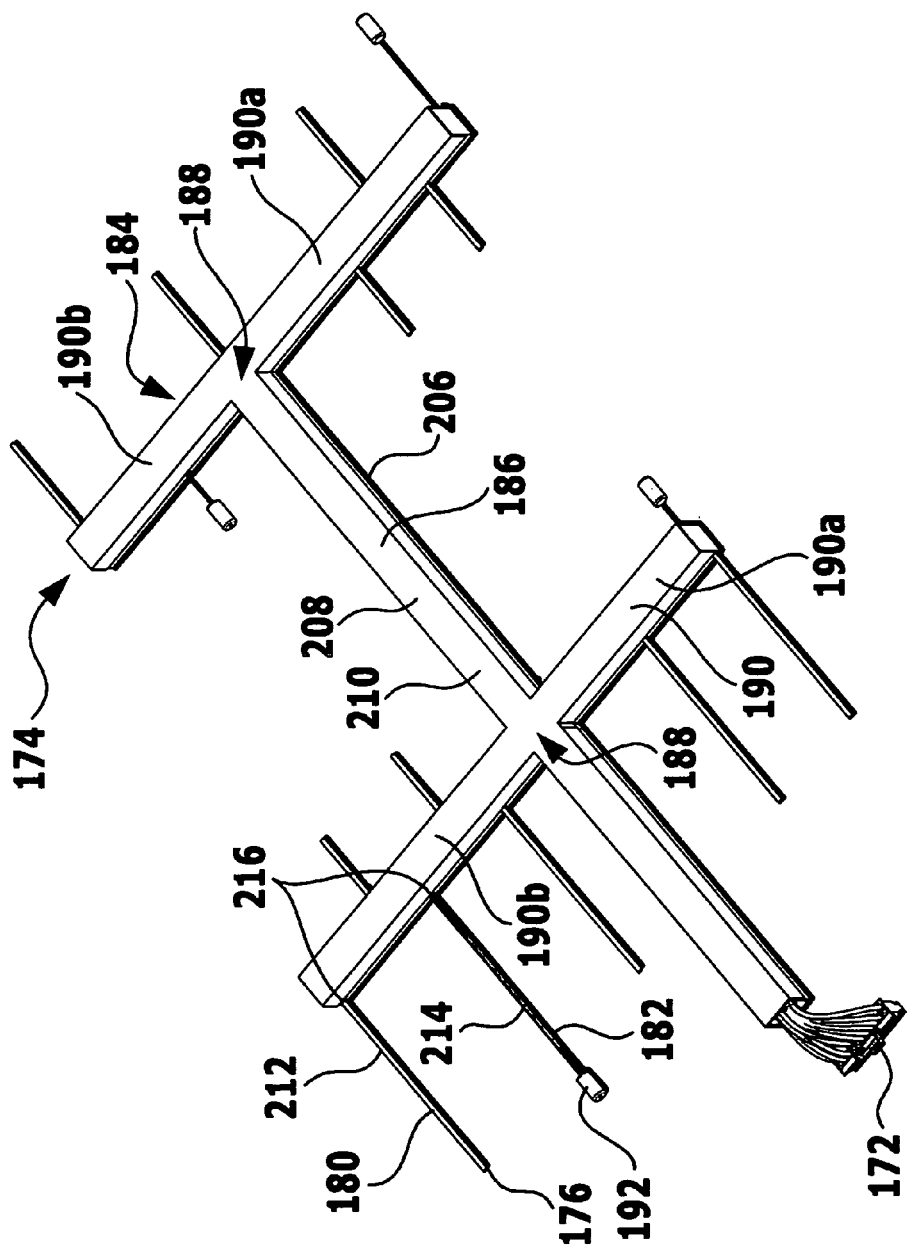
FIG. 4 a schematic perspective illustration of a second embodiment of a conduit system incorporating branching points from which subsidiary seating channels extend away in mutually opposite directions from a main seating channel of the conduit system.

A second embodiment of a conduit system that is illustrated in FIG. 4 differs from the first embodiment illustrated in FIGS. 1 to 3 in that the stiffening structure 184 is not open at one side but rather, it is in the form of a closed structure around the voltage tapping lines 180 and the temperature measuring lines 182.

In particular, the stiffening structure 184 can comprise a lower part 206 which forms a base of the main seating channel 186 and the subsidiary seating channels 190 of the stiffening structure 184, and an upper part 208 which is arranged on the lower part 206 as a covering cap 210 and closes the main seating channel 186 and the subsidiary seating channels 190 of the stiffening structure 184 on the side remote from the lower part 206.

The lower part 206 and the upper part 208 may, for example, have a U-shaped cross-section in each section of the main seating channel 186 and the subsidiary seating channels 190, wherein the open sides of these U-shaped cross-sections of the lower part 206 and the upper part 208 face each other.

Furthermore, provision may be made for the lower part 206 and the upper part 208 to be fixed together, preferably in releasable manner, by means of a latching process for example or by means of a cohesive connection and in particular by welding.

The lower part 206 and the upper part 208 of the stiffening structure 184 can be formed from the same materials as the stiffening structure 184 of the embodiment illustrated in FIGS. 1 to 3.

The lower part 206 and/or the upper part 208 may be in the form of injection moulded parts.

Each voltage tapping line 180 of the conduit system 174 comprises a measuring point section 212 which runs outside the stiffening structure 184 from the respective voltage tapping point 176 up to the wall of the stiffening structure 184, and a supported section which runs within the stiffening structure 184 up to the respective plug 172.

In like manner, the temperature measuring lines 182 of the conduit system 174 each comprise a measuring point section 214 which is arranged outside the stiffening structure 184 and runs from the respectively associated temperature sensor 192 up to the wall of the stiffening structure 184, and a supported section which runs within the stiffening structure 184 to the respective plug 172.

The measuring point sections 212 of the voltage tapping lines 180 and the measuring point sections 214 of the temperature measuring lines 182 pass out from the stiffening structure 184 through recesses 216 provided in the wall of the stiffening structure 184.

Preferably, the measuring point sections 212 and 214 pass out from the subsidiary seating channels 190 of the stiffening structure 184.

The voltage tapping line 180 and the temperature measuring line 182 are fixed, preferably in releasable manner, to the lower part 206 and/or the upper part 208 of the stiffening structure 184 by means of one or more holding devices.

If all the voltage tapping lines and temperature measuring lines 182 are fixed to the lower part 206 of the stiffening structure 184, the upper part 208 of the stiffening structure 184 can be removed after the voltage tapping lines 180 and the temperature measuring lines 182 have been connected to the functional elements 136 of the electro-chemical device 100; in this case, the upper part 208 merely serves to assist the assembly process and it is no longer present when the electro-chemical device 100 is ready for use.

If all the voltage tapping lines 180 and temperature measuring lines 182 are fixed to the upper part 208 of the stiffening structure 184, the lower part 206 can be removed after the voltage tapping lines 180 and the temperature measuring lines 182 have been connected to the functional elements 136 of the electro-chemical device 100; in this case, the lower part 206 merely serves to assist the assembly process and it is no longer present when the electro-chemical device 100 is ready for use.

In principle, it is also conceivable for the entire stiffening structure 184 to serve merely as an aid to the assembly process and for it to be removed in its entirety after the voltage tapping lines 180 and the temperature measuring lines 182 have been connected to the functional elements 136 of the electro-chemical device 100 so that the stiffening structure 184 is no longer present when the electro-chemical device 100 is ready for use.

By way of example, the second embodiment of a conduit system 174 that is illustrated in FIG. 4 is formed in such a way that two subsidiary seating channels 190 extend away, preferably in mutually opposite directions, from the main seating channel 186 of the stiffening structure 184 at each of the branching points 188 of the stiffening structure 184.

Figure 5:
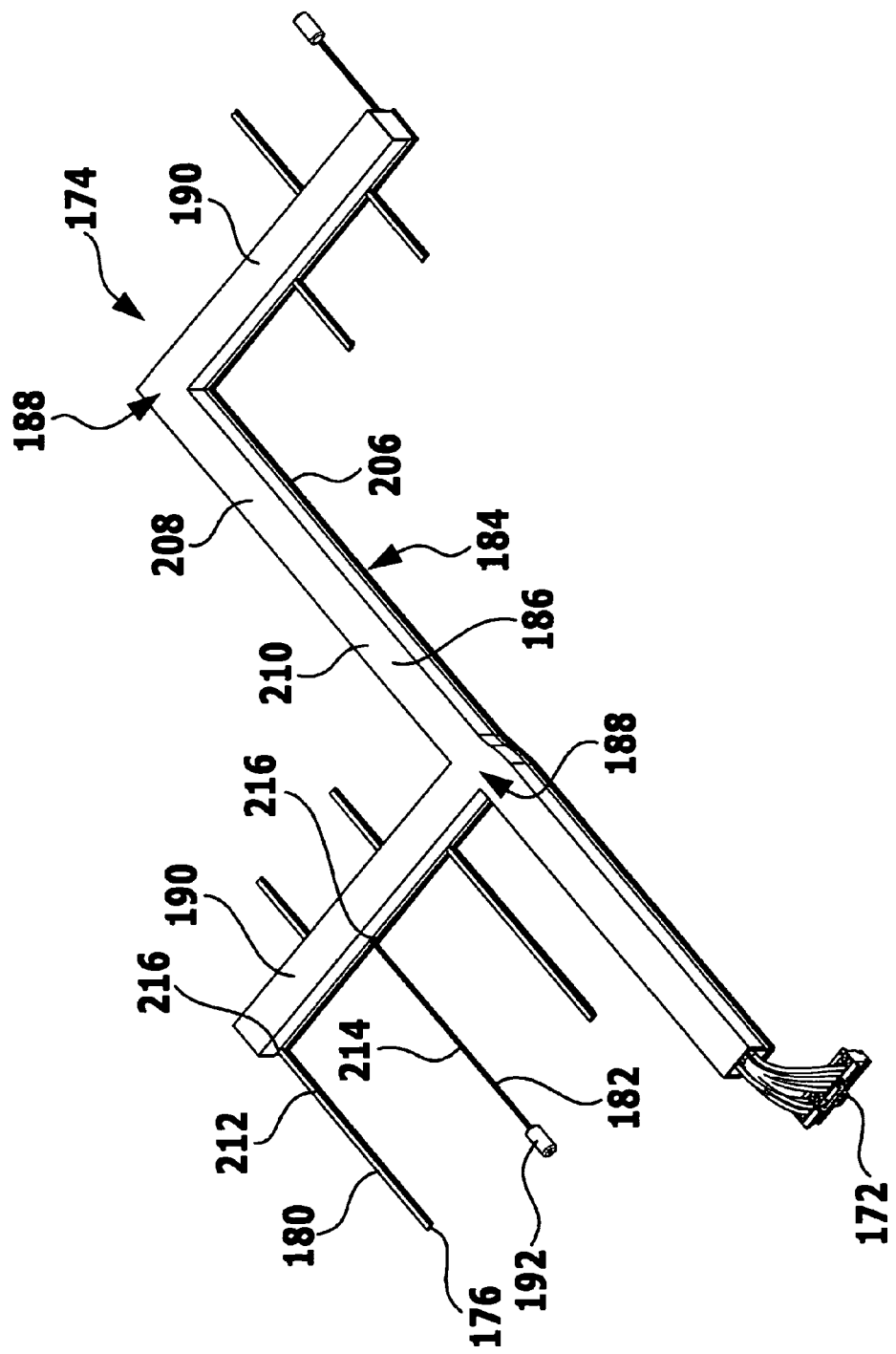
FIG. 5 a schematic perspective illustration of a third embodiment of a conduit system incorporating branching points at each of which only one subsidiary seating channel extends away from a main seating channel of the conduit system.

A third embodiment of a conduit system 174 that is illustrated in FIG. 5 differs from the second embodiment illustrated in FIG. 4 in that just one subsidiary seating channel 190 branches off from the main seating channel 186 of the stiffening structure 184 at each of the branching points 188.

In principle however, any number of subsidiary seating channels 190 could branch off from the main seating channel 186 at each branching point 188 of the stiffening structure 184, namely, in basically arbitrary directions, and it is also possible for the stiffening structure 184 to be formed in such a way that one or more subsidiary seating channels 190 may themselves branch out again into one or more minor subsidiary seating channels.

In all other respects, the conduit systems 174 illustrated in FIGS. 4 and 5 correspond as regards the construction, method of production and functioning thereof to the first embodiment illustrated in FIGS. 1 to 3 and insofar reference is made to the preceding description.

Figure 6:
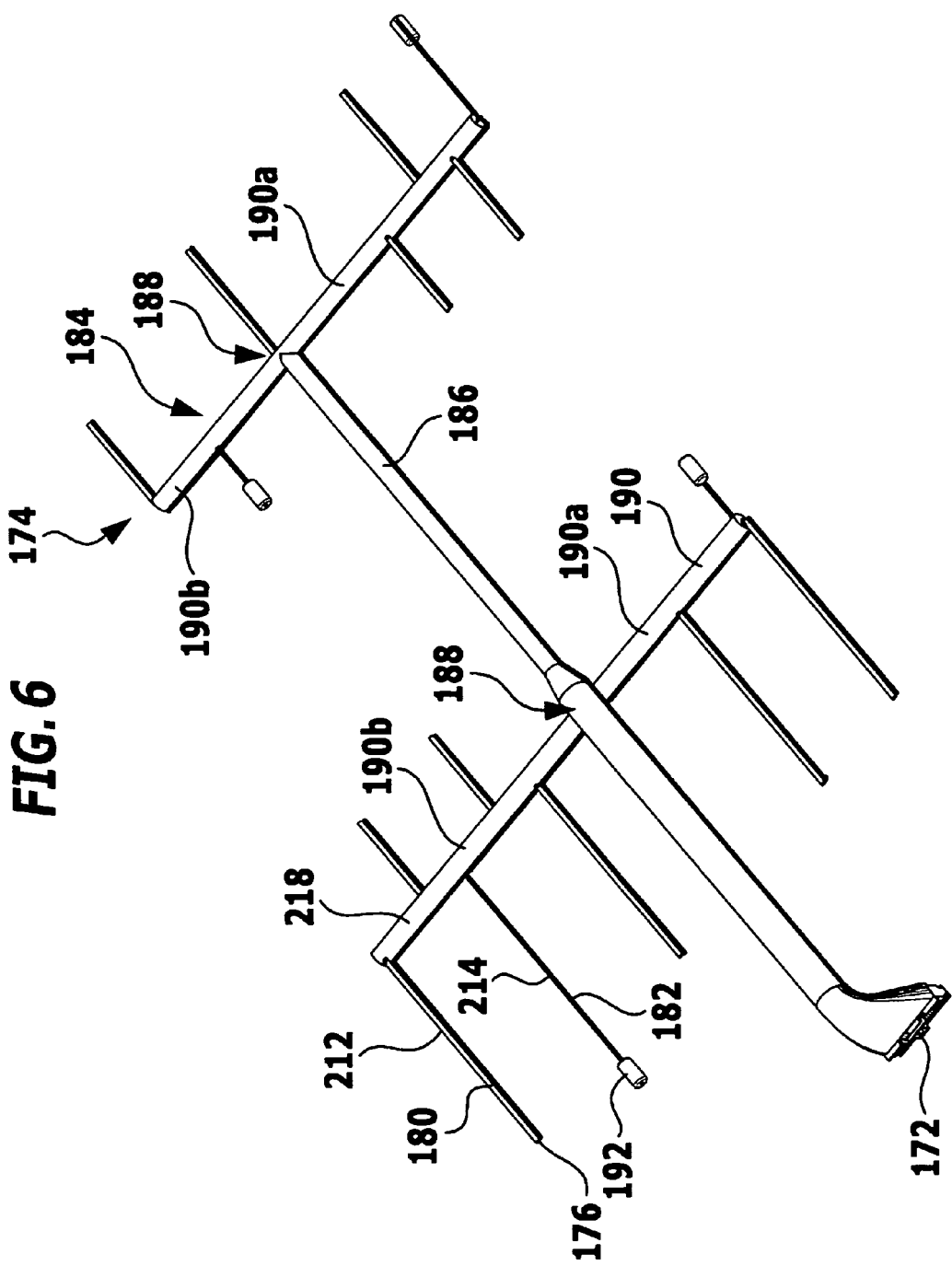
FIG. 6 a schematic perspective illustration of a fourth embodiment of a conduit system in which voltage tapping lines and/or temperature measuring lines are encapsulated in a sheath formed on the lines.

A fourth embodiment of a conduit system 174 that is illustrated in FIG. 6 differs from the second embodiment illustrated in FIG. 4 in that the stiffening structure 184 was not manufactured separately from the voltage tapping lines 180 and the temperature measuring lines 182 and only connected subsequently to these lines but rather, the voltage tapping lines 180 and the temperature measuring lines 182 of the conduit system 174 were arranged with the desired relative positioning and orientation and then sections of the voltage tapping lines 180 and the temperature measuring lines 182 were provided with a sheathing 218 which encloses these sections of the said lines and thereby forms an inherently stable stiffening structure 184 of the conduit system 174.

In particular, the material of the sheathing 218 may comprise a synthetic material, especially an elastomer material.

Preferably, the sheathing 218 is formed substantially in its entirety from a synthetic material, in particular from an elastomer material.

In particular, the sheathing 218 can be formed by a process of spraying it onto the voltage tapping lines 180 and the temperature measuring lines 182.

In the case of this embodiment too, the stiffening structure 184 of the conduit system 174 is inherently stable; the stiffening structure 184 is however preferably deformable in a plastic and/or resilient manner, this being something which can facilitate the handling of the conduit system 174 during the assembly of the electro-chemical device 100.

In all other respects the fourth embodiment of a conduit system 174 that is illustrated in FIG. 6 corresponds in regard to the construction, method of production and functioning thereof to the second embodiment illustrated in FIG. 4 and insofar reference is made to the preceding description.

The invention claimed is:

1. An electro-chemical device which comprises a plurality of electro-chemical cells and at least one conduit system for connecting a plurality of voltage tapping points and/or temperature measuring points of the electro-chemical device to a monitoring unit of the elector-chemical device, wherein the conduit system comprises a plurality of voltage tapping lines and/or temperature measuring lines and a stiffening structure in which and/or on which the plurality of voltage tapping lines and/or temperature measuring lines are arranged at least in sections thereof,
   wherein the electro-chemical device comprises a cover which comprises a carrier element that faces the electro-chemical cells of the electro-chemical device and a covering element that is arranged on the side of the carrier element facing away from the electro-chemical cells of the electro-chemical device,
   wherein the conduit system is arranged between the carrier element and the covering element,
   wherein the covering element is fixed directly to the carrier element in a releasable manner,
   wherein the carrier element is provided with a plurality of passage openings, wherein each passage opening is associated with a contact region of a functional element of the electro-chemical device and with a cell terminal of the electro-chemical cells of the electro-chemical device so that in each case a cell terminal is connectable t an associated contact region of a functional element through such a passage opening,
   wherein the covering element covers the functional elements and the passage openings of the carrier element and the at least one conduit system,
   wherein the stiffening structure comprises a plurality of seating channels for accommodating at least one voltage tapping line and/or at least one temperature measuring line,
   wherein the stiffening structure is made separate from the carrier element and fixed to the carrier element and comprises at least one main seating channel and a plurality of branching points at which one or more subsidiary seating channels are branched off from the main seating channel, and
   wherein at least one of the main seating channel and the subsidiary seating channels have a substantially U-shaped cross-section.

2. An electro-chemical device in accordance with claim 1, wherein at least one of the voltage tapping lines and/or at least one of the temperature measuring lines comprises a measuring point section which is connectable to a voltage tapping point or to a temperature measuring point and is arranged outside the stiffening structure.

3. An electro-chemical device in accordance with claim 1, wherein the conduit system comprises a multi-pole plug which is connected to a plurality of voltage tapping lines and/or temperature measuring lines of the conduit system and to which is connectable a connecting line leading to the monitoring unit.

4. An electro-chemical device in accordance with claim 1, wherein the conduit system comprises at least one temperature sensor.

5. An electro-chemical device in accordance with claim 1, wherein the stiffening structure is connected to the voltage tapping lines and/or the temperature measuring lines of the conduit system in releasable manner.

6. An electro-chemical device in accordance with claim 1, wherein the conduit system comprises a sealing cover for the at least partial closure of at least one seating channel of the stiffening structure.

7. An electro-chemical device in accordance with claim 1, wherein the conduit system comprises at least one holding device by means of which at least one voltage tapping line and/or at least one temperature measuring line is fixable to the stiffening structure.

8. An electro-chemical device in accordance with claim 1, wherein the stiffening structure comprises an injection mouldable material.

9. An electro-chemical device in accordance with claim 1, wherein the stiffening structure comprises a metallic shaped part.

10. An electro-chemical device in accordance with claim 1, wherein the stiffening structure comprises a sheathing which is formed on sections of voltage tapping lines and/or on sections of temperature measuring lines.

11. An electro-chemical device in accordance with claim 1, wherein the electro-chemical device further comprises at least one cell connector for the electrically conductive connection of a first cell terminal of a first electro-chemical cell and a second cell terminal of a second electro-chemical cell, wherein at least one voltage tapping line and/or at least one temperature measuring line of the conduit system is connected to at least one cell connector.

12. An electro-chemical device in accordance with claim 1, wherein the conduit system is fixed to the carrier element in releasable manner.

13. An electro-chemical device in accordance with claim 1, wherein the stiffening structure is fixed to the carrier element by latching.

* * * * *

UNITED STATES PATENT AND TRADEMARK OFFICE
CERTIFICATE OF CORRECTION

PATENT NO. : 10,056,588 B2
APPLICATION NO. : 13/506796
DATED : August 21, 2018
INVENTOR(S) : Mark Laderer et al.

Page 1 of 1

It is certified that error appears in the above-identified patent and that said Letters Patent is hereby corrected as shown below:

In the Claims

In Column 13, Line 35 (Claim 1) should read:
-- to an associated contact region of a functional element --

Signed and Sealed this
Twenty-sixth Day of November, 2019

Andrei Iancu
*Director of the United States Patent and Trademark Office*